(12) United States Patent
Kobayashi

(10) Patent No.: US 12,139,176 B2
(45) Date of Patent: Nov. 12, 2024

(54) GRIPPER DEVICE, CONVEYANCE VEHICLE, AND CONVEYANCE METHOD

(71) Applicant: MURATA MACHINERY, LTD., Kyoto (JP)

(72) Inventor: Makoto Kobayashi, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 217 days.

(21) Appl. No.: 17/910,384

(22) PCT Filed: Jan. 27, 2021

(86) PCT No.: PCT/JP2021/002788
§ 371 (c)(1),
(2) Date: Sep. 9, 2022

(87) PCT Pub. No.: WO2021/181923
PCT Pub. Date: Sep. 16, 2021

(65) Prior Publication Data
US 2023/0134312 A1 May 4, 2023

(30) Foreign Application Priority Data

Mar. 13, 2020 (JP) .................................. 2020-044629

(51) Int. Cl.
*B66C 1/28* (2006.01)
*B61B 3/02* (2006.01)
(Continued)

(52) U.S. Cl.
CPC .................. *B61B 3/02* (2013.01); *B66C 1/28* (2013.01); *B66C 13/04* (2013.01);
(Continued)

(58) Field of Classification Search
CPC ....... B66C 13/04; B66C 13/06; B25J 15/0266
(Continued)

(56) References Cited

U.S. PATENT DOCUMENTS 3,438,510 A * 4/1969 Fawell .................... B66C 1/425
212/334
6,099,059 A * 8/2000 Schultz .................. B65G 47/90
414/940

(Continued)

FOREIGN PATENT DOCUMENTS

| JP | 2005-026596 A | 1/2005 |
| JP | 2011-035022 A | 2/2011 |
| JP | 6607175 B2 | 11/2019 |

OTHER PUBLICATIONS

JP 2005/026594A Machine Translation (Year: 2005).*
(Continued)

*Primary Examiner* — Michael R Mansen
*Assistant Examiner* — Juan J Campos, Jr.
(74) *Attorney, Agent, or Firm* — Keating & Bennett, LLP

(57) ABSTRACT

A gripper device includes a pair of engaging portions attached to an elevating section capable of lifting and lowering above an article and respectively engageable with the pair of held portions, and a driver to move the pair of engaging portions from a standby position where a distance between the pair of engaging portions is shorter than an interval between the pair of held portions, to an engaging position where the pair of engaging portions is capable of engaging with the pair of held portions, such that the pair of engaging portions separate from one another.

5 Claims, 9 Drawing Sheets

(51) Int. Cl.
*B66C 13/04* (2006.01)
*H01L 21/673* (2006.01)
*H01L 21/677* (2006.01)

(52) U.S. Cl.
CPC .... *H01L 21/67379* (2013.01); *H01L 21/6773* (2013.01); *H01L 21/67733* (2013.01); *B65G 2201/0297* (2013.01); *B65G 2811/09* (2013.01)

(58) Field of Classification Search
USPC .............................................. 294/207, 119.1
See application file for complete search history.

(56) References Cited

U.S. PATENT DOCUMENTS

| | | | | |
|---|---|---|---|---|
| 6,468,021 | B1 | 10/2002 | Bonora et al. | |
| 7,464,823 | B2* | 12/2008 | Nakao | B66C 13/06 212/331 |
| 8,602,470 | B2* | 12/2013 | Bieler | B25J 15/0475 294/207 |
| 9,168,930 | B2* | 10/2015 | Wada | H01L 21/67733 |
| 9,362,152 | B2* | 6/2016 | Wada | B66C 13/18 |
| 9,685,360 | B2* | 6/2017 | Kinugawa | H01L 21/67733 |
| 9,938,120 | B2* | 4/2018 | Tomida | H01L 21/67733 |
| 2011/0024377 | A1 | 2/2011 | Yamamoto | |
| 2012/0000875 | A1* | 1/2012 | Kawabata | H01L 21/67733 294/207 |
| 2014/0047995 | A1* | 2/2014 | Kobayashi | B61B 3/00 104/89 |
| 2015/0063963 | A1* | 3/2015 | Kinugawa | B25J 15/0052 414/561 |
| 2015/0255318 | A1* | 9/2015 | Wada | H01L 21/67265 212/71 |
| 2015/0287623 | A1* | 10/2015 | Wada | H01L 21/67733 212/330 |
| 2020/0331503 | A1* | 10/2020 | Kobayashi | H01L 21/677 |

OTHER PUBLICATIONS

Official Communication issued in International Patent Application No. PCT/JP2021/002788, mailed on Apr. 20, 2021.
Official Communication issued in International Patent Application No. PCT/JP2021/002788, mailed on Sep. 22, 2022.
English translation of Official Communication issued in International Patent Application No. PCT/JP2021/002788, mailed on Apr. 20, 2021.
Official Communication issued in corresponding European Patent Application No. 21768710.2, mailed on Apr. 3, 2024.

* cited by examiner

GRIPPER DEVICE, CONVEYANCE VEHICLE, AND CONVEYANCE METHOD

BACKGROUND OF THE INVENTION

1. Field of the Invention

The present disclosure relates to a gripper device that holds an article, a conveyance vehicle including the gripper device, and a conveyance method for holding and carrying the article.

2. Description of the Related Art

As described in Japanese Unexamined Patent Publication No. 2011-35022, an overhead conveyance vehicle system is known that transports an article, such as a front opening unified pod (FOUP), in a state of suspending the article. In this system, a flange provided on a top surface of the FOUP is gripped from both sides of the flange by an elevating platform.

SUMMARY OF THE INVENTION

In the above-described conventional system, a single flange is provided on the top surface of the article, and this flange is gripped by an elevating platform. A large gripper device is needed to grip the flange from both sides thereof.

Preferred embodiments of the present disclosure provide gripper devices, conveyance vehicles, and conveyance methods that are each able to hold an article in a compact configuration.

A preferred embodiment of the present disclosure provides a gripper device to hold an article including a pair of held portions that are provided on a top surface of the article and that are spaced apart in a direction along the top surface, the gripper device including a pair of engaging portions that are attached to an elevating section capable of lifting and lowering above the article and are respectively engageable with the pair of held portions, and a driver to move the pair of engaging portions along the above-described direction, from a standby position where a distance between the pair of engaging portions is less than an interval between the pair of held portions, to an engaging position where the pair of engaging portions is capable of engaging with the pair of held portions, such that the pair of engaging portions separate from one another.

According to this gripper device, the pair of engaging portions attached to the elevating section is able to be moved from the standby position to the engaging position by the driver. The top surface of the article is provided with the pair of held portions that are spaced apart in a predetermined direction. The pair of engaging portions are between (inside) the pair of held portions when the gripper device is to hold the article, and are moved from inside to outside of the article along the above-described predetermined direction. This arrangement of the engaging portions, and their movement and engagement in a single direction, make the gripper device compact as a whole. According to this gripper device, an article is able to be held in a compact configuration.

The gripper device may include a pair of drop preventing sections that are fixed to the elevating section and capable of being spaced apart in the direction with a longer interval than the interval between the pair of held portions. A first gap exists between each of the pair of drop preventing sections and each of the pair of engaging portions at the standby position, the first gap allowing each of the pair of held portions to vertically pass therethrough, and a second gap exists between each of the pair of drop preventing sections and each of the pair of engaging portions located at the engaging position, the second gap not allowing each of the pair of held portions to vertically pass therethrough. When the elevating section is lowered in a state where the pair of engaging portions are located at the standby position, the held portion passes through the first gap between the engaging portion and the drop preventing section in each of both end regions in the above-described direction. When the pair of engaging portions are moved to the engaging position and engage with the pair of held portions, in each of both end regions in the above-described direction, the held portion is not able to pass through the second gap between the engaging portion and the drop preventing section. Even if one of the held portions (or one of the engaging portions) is damaged due to some unforeseen event, for example, the other held portion is held and maintained between the other engaging portion and the drop preventing section. Thus, an engagement structure of either one of the engaging portions is able to be maintained, and the article is able to be prevented from dropping.

The article may be provided with at least a pair of columns on the top surface of the article and a pair of held portions fixed to the columns. Each of the pair of engaging portions may have a notch that accepts the column when the pair of engaging portions are located in the engaging position. According to this configuration, when the columns are provided, a space into which the engaging portion is inserted is able to be easily provided between the top surface of the article and the held portion. Furthermore, in the movement of the engaging portions in the above-described direction, it is possible to perform control, for example, to allow a portion of the engaging portion to come into contact with the column from the inside. In such a case, the engaging portions are able to be positioned securely and easily.

The driver may include a single link mechanism to move the pair of engaging portions. Since only one link mechanism is used to move the pair of engaging portions, the structure of the driver is simpler than when multiple link mechanisms are used. In addition, since one common link mechanism is provided for the pair of engaging portions, the operation of the pair of engaging portions is more easily synchronized.

According to another preferred embodiment of the present disclosure, there may be provided a conveyance vehicle that includes either of the above-described gripper devices and travels along a track provided on a ceiling. According to this conveyance vehicle, since the gripper device has the compact configuration described above, the conveyance vehicle is able to be made compact and lightweight relative to the article in the size, the weight, and the like.

A further preferred embodiment of the present disclosure provides a conveyance method for holding and carrying, with a gripper device, an article with a pair of held portions that are provided on a top surface of the article and spaced apart in a direction along the top surface, in which the gripper device includes a pair of engaging portions attached to an elevating section capable of lifting and lowering above the article and that respectively engage with the pair of held portions, the conveyance method including lowering the elevating section, moving the pair of engaging portions along a direction from a standby position where the distance between the pair of engaging portions is less than an interval between the pair of held portions to an engaging position where the pair of engaging portions is capable of engaging with the pair of held portions, and holding the article by causing the elevating section to lift and causing the pair of engaging portions in the engaging position to engage with the pair of held portions.

According to this conveyance method, the same actions and effects as described above are achieved. In other words, in the holding step, an article is able to be held in the compact configuration. The gripper device has the compact configuration, and is able to make use of the advantage of being compact and lightweight when carrying held an article. For example, this conveyance method is also advantageous in terms of providing faster carrying speeds and reducing power consumption.

According to preferred embodiments of the present disclosure, an article is able to be held in the compact configuration.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
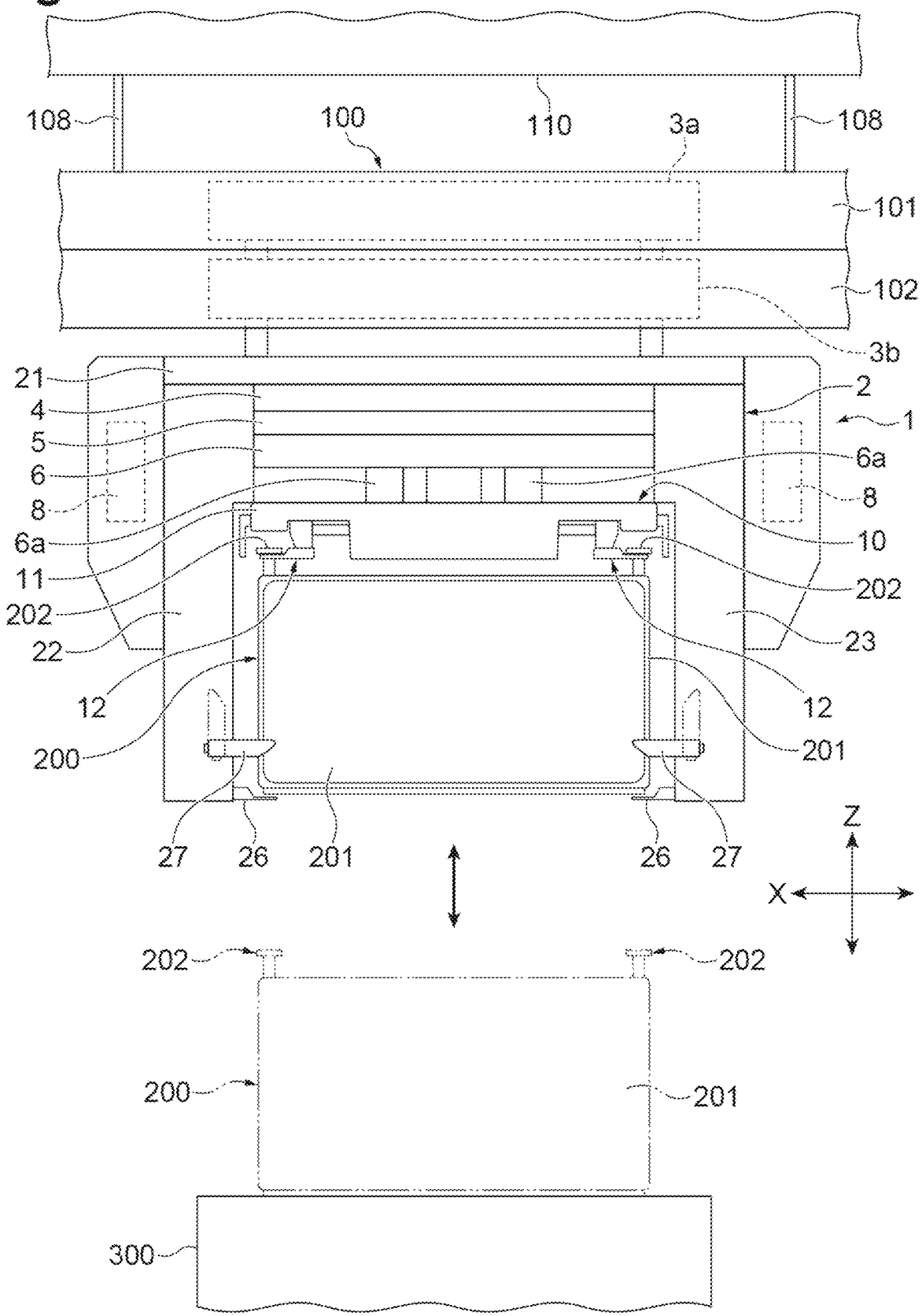
FIG. 1 is a diagram illustrating an outline configuration of a conveyance vehicle including a gripper device according to a preferred embodiment of the present disclosure.

As illustrated in FIG. 1, an overhead conveyance vehicle (conveyance vehicle) 1 according to a preferred embodiment of the present invention travels along a track 100 laid on a ceiling 110 of a clean room where semiconductor devices are manufactured. The overhead conveyance vehicle 1 of the one embodiment carries front opening unified pod (FOUP) (article) 200 accommodating a plurality of semiconductor wafers, and transfers the FOUP 200 to a load port 300 or the like that is a transfer section provided in a processing device that performs various types of processing on the semiconductor wafers. The track 100 is suspended from the ceiling 110 by a suspension column 108. The track 100 includes a traveling rail 101 and a feeder rail 102 that is provided at a lower portion of the traveling rail 101.

The overhead conveyance vehicle 1 includes a frame unit 2, a traveling unit 3a, a power receiving unit 3b, a lateral unit 4, a theta unit 5, an elevating drive unit 6, a gripper device 10, and a controller 8. The frame unit 2 includes a center frame 21, a front frame 22, and a rear frame 23. The front frame 22 extends downward from an end of a front side (front side in a travel direction of the overhead conveyance vehicle 1) in the center frame 21 to a lower side thereof. The rear frame 23 extends downward from an end of a rear side (rear side in the travel direction of the overhead conveyance vehicle 1) in the center frame 21 to the lower side thereof.

The traveling unit 3a and the power receiving unit 3b are disposed on the upper side of the center frame 21. The traveling unit 3a is attached to the traveling rail 101. The power receiving unit 3b receives, for example, power supply in a non-contact manner from a high-frequency current line laid along the feeder rail 102. The power supply to the power receiving unit 3b causes the traveling unit 3a to travel along the track 100. The lateral unit 4 is disposed on the lower side of the center frame 21. The lateral unit 4 moves the theta unit 5, the elevating drive unit 6, and the gripper device 10 to move laterally (side in the travel direction of the overhead conveyance vehicle 1). The theta unit 5 is disposed on a lower side of the lateral unit 4. The theta unit 5 rotates the elevating drive unit 6 and the gripper device 10 in a horizontal plane.

The elevating drive unit 6 is disposed on the lower side of the theta unit 5. The elevating drive unit 6 lifts and lowers gripper device 10. The gripper device 10 is disposed on the lower side of the elevating drive unit 6. The gripper device 10 holds a flange section (held portion) 202 of the FOUP 200. The controller 8 is disposed on the front frame 22 and the rear frame 23. The controller 8 is an electronic control unit including a CPU, ROM, and RAM. The controller 8 controls each element or component of the overhead conveyance vehicle 1.

To the front frame 22 and the rear frame 23, four lower drop preventing sections 26 and two lid drop preventing sections 27 that each prevent the FOUP 200 from dropping from the frame unit 2 are attached. The lower drop preventing sections 26 are correspondingly attached to the lower end of the front frame 22 and the lower end of the rear frame 23 at the four corner positions of the frame unit 2 and correspondingly face the front end and the rear end of the bottom of the FOUP 200. The lid drop preventing sections 27 are attached to the lower portion of the front frame 22 and the lower portion of the rear frame 23, respectively, and face the FOUP 200 from the lid 205 side (see FIG. 3). These lower drop preventing sections 26 and the lid drop preventing sections 27 are opened and closed at appropriate timing in association with transfer of the FOUP 200.

The overhead conveyance vehicle 1 configured as described above operates, as an example, described below. When the FOUP 200 is transferred from a load port 300 to the overhead conveyance vehicle 1, the overhead conveyance vehicle 1 that does not hold the FOUP 200 stops above the load port 300. When a horizontal position of the gripper device 10 deviates from the position directly above the load port 300, the horizontal position and an angle of a holding unit are fine-tuned by driving the lateral unit 4 and the theta unit 5 to fine-tune the whole elevating drive unit 6. Subsequently, the elevating drive unit 6 lowers the gripper device 10, and the gripper device 10 holds the flange section 202 of the FOUP 200 that is placed on the load port 300. The elevating drive unit 6 then lifts the gripper device 10 to a lifting end and disposes the FOUP 200 between the front frame 22 and the rear frame 23. The lower drop preventing sections 26 and the lid drop preventing sections 27 are closed. The overhead conveyance vehicle 1 holding the FOUP 200 then begins traveling.

When the FOUP 200 is transferred from the overhead conveyance vehicle 1 to the load port 300, the overhead conveyance vehicle 1 holding the FOUP 200 stops above the load port 300. The lower drop preventing section 26 and the lid drop preventing section 27 are opened. When the horizontal position of the gripper device 10 (FOUP 200) deviates from a position directly above the load port 300, the horizontal position and the angle of the holding unit are fine-tuned by driving the lateral unit 4 and the theta unit 5 to fine-tune the whole elevating drive unit 6. Subsequently, the elevating drive unit 6 lowers the gripper device 10 to place the FOUP 200 on the load port 300, and the gripper device 10 releases its holding of the flange section 202 of the FOUP 200. The elevating drive unit 6 then lifts the gripper device 10 to the lifting end thereof. The overhead conveyance vehicle 1 that does not hold the FOUP 200, then begins traveling.

Figure 2:
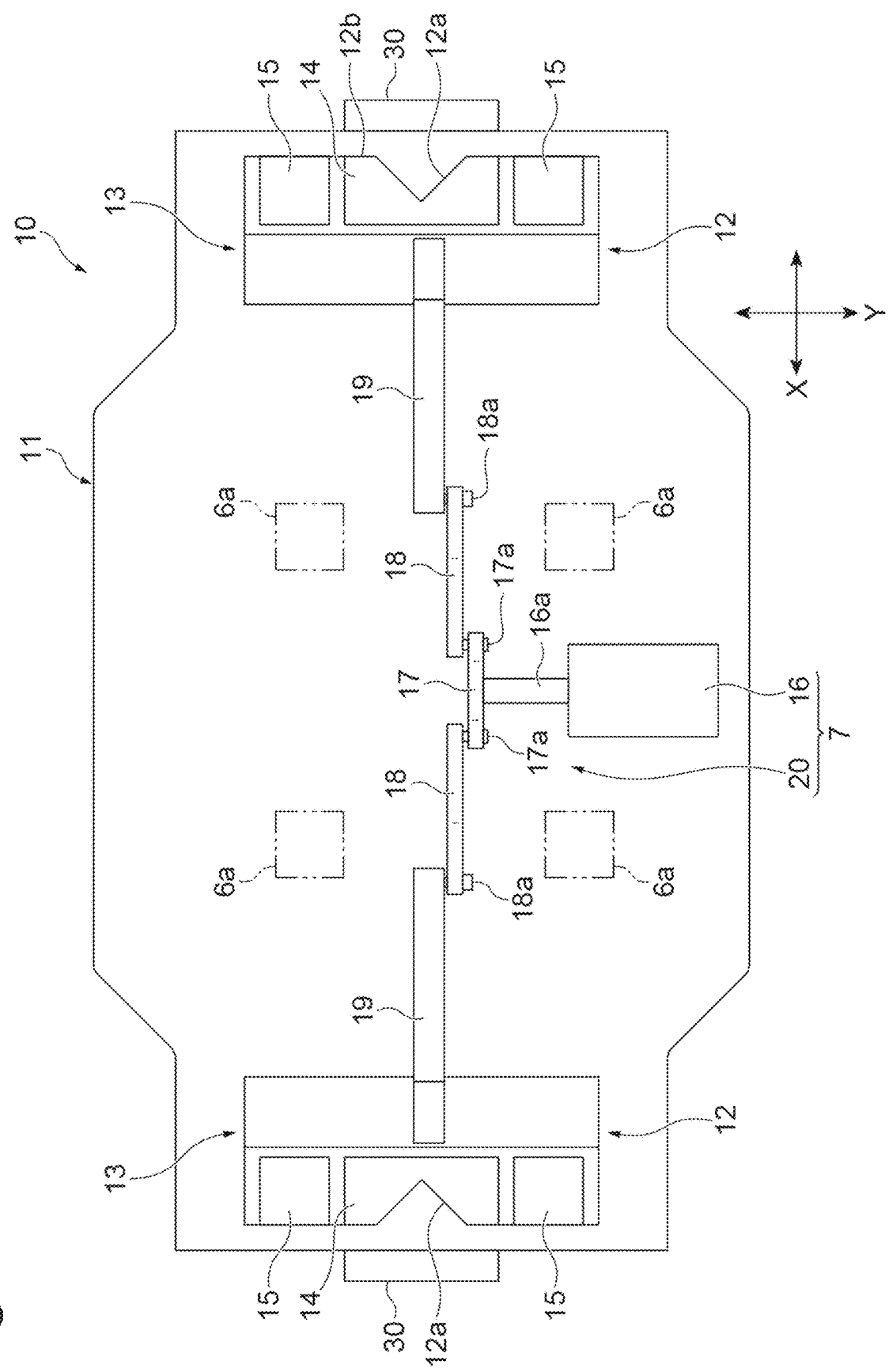
FIG. 2 is a plan view of the gripper device in FIG. 1.

As illustrated in FIG. 2, the gripper device 10 includes an elevating section 11 that defines a body of the gripper device 10, a motor 16 fixed to the elevating section 11, a single link mechanism 20 connected to the motor 16 via an output shaft 16a of the motor 16, and a pair of finger sections (engaging portions) 12 attached to respective tips of the link mechanism 20. The motor 16, the link mechanism 20, and the pair of finger sections 12 are attached to the elevating section 11. The motor 16 and the link mechanism 20 are included in the drive section 7 that moves the pair of finger sections 12. The elevating section 11 is suspended by, for example, four belts 6a that are included in the elevating drive unit 6 described above. The elevating section 11 is capable of lifting and lowering above the FOUP 200 (above the load port 300) when the elevating drive unit 6 is controlled by the controller 8. It should be noted that the elevating drive unit 6 may include three belts 6a and the elevating section 11 may be suspended by the three belts 6a.

Figure 3:
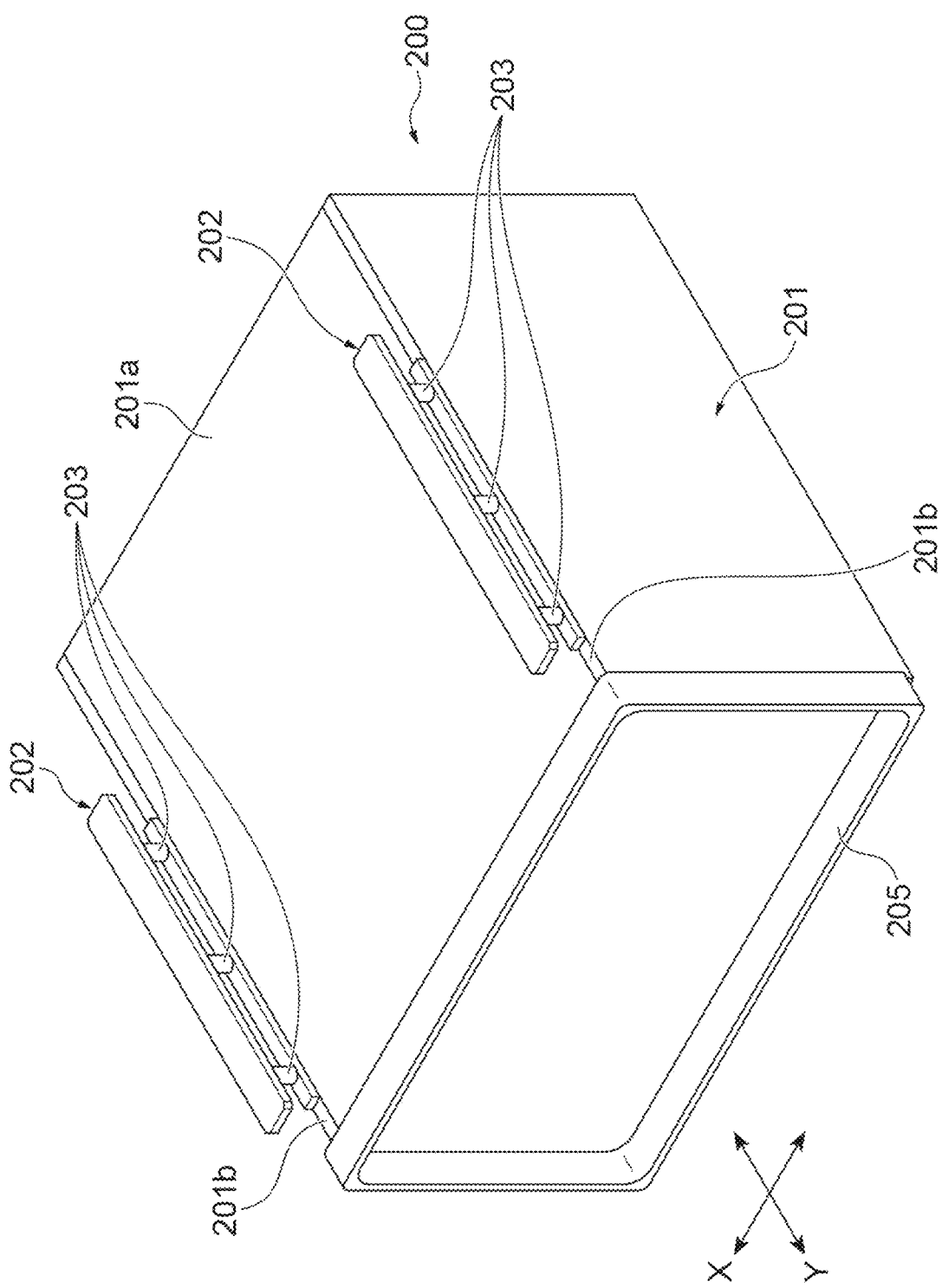
FIG. 3 is a perspective view of an article to be carried by a conveyance vehicle system of FIG. 1.

Referring to FIG. 3, the FOUP 200 held by the gripper device 10 of the present preferred embodiment is described. The FOUP 200 includes a body 201 having a rectangular parallelepiped shape, for example. A lid 205 is attached to a side surface of the body 201 (a surface of a side in the travel direction of the overhead conveyance vehicle 1) so as to be opened and closed freely. The FOUP 200 accommodates a plurality of semiconductor wafers in the body 201. The FOUP 200 may accommodate a plurality of semiconductor panels that each are a rectangular-shaped substrate, within the body 201. A top surface 201a, having a rectangular shape, of the body 201 is provided with a pair of flange sections 202 that are held by the gripper device 10. The pair of flange sections 202 are spaced apart in a direction along the top surface 201a and corresponding to the travel direction of the overhead conveyance vehicle 1 (X direction indicated in the figure). In the following description, this direction is referred to as a "first direction". The pair of flange sections 202 are disposed at ends 201b and 201b in an X direction of the top surface 201a and each extend long in a direction along the top surface 201a and orthogonal to the above-described first direction (Y direction indicated in the figure). In the following description, a direction orthogonal to this first direction is referred to as a "second direction". These terms of the first direction and the second direction are able to be used to describe the FOUP 200, and are able to also be used to describe the gripper device 10 that holds the FOUP 200. As described above, the first direction corresponds to the travel direction of the overhead conveyance vehicle 1 in a state where the elevating drive unit 6 and the gripper device 10 are aligned with the frame unit 2.

More specifically, a plurality of pairs (three pairs in the present preferred embodiment) of columns 203 are erected on the top surface 201a of the FOUP 200 at each of the ends 201b and 201b. The three columns 203 are spaced apart in the Y direction, and aligned in the Y direction, for example. Each of the columns 203 extends perpendicular to the top surface 201a, and its lower end is fixed to the top surface 201a. At one end 201b in the first direction of the top surface 201a, three equal-length columns 203, for example, are erected, and one plate of the flange section 202 is fixed to the upper end of each of these columns 203 by welding or bolts. Each of the flange sections 202 is, for example, a long plate-shaped member that is disposed parallel to the top surface 201a and extends in the Y direction. At the other end 201b in the first direction of the top surface 201a, for example, three columns 203 having an equal length are erected, and one plate of the flange section 202 is fixed to the upper end of each of these columns 203 by welding or bolts. The pair of flange sections 202 extend parallel, for example, to the top surface 201a of the FOUP 200. As explained above, the FOUP 200 has the pair of flange sections 202 provided on the top surface 201a and spaced apart in the first direction along the top surface 201a.

When the column 203 is provided, a predetermined space is provided between the top surface 201a and the flange section 202. As illustrated in FIG. 1, the pair of flange sections 202 fall within a length of the body 201 in the first direction (the overall length of the FOUP 200). The finger section 12 of the gripper device 10 is inserted into a space between the top surface 201a and the flange section 202, from the center of the top surface 201a to the end 201b. The FOUP 200 is an article that is held (supported) from below by the finger section 12 that is moved from inside to outside and inserted into the above-described space.

Figure 4:
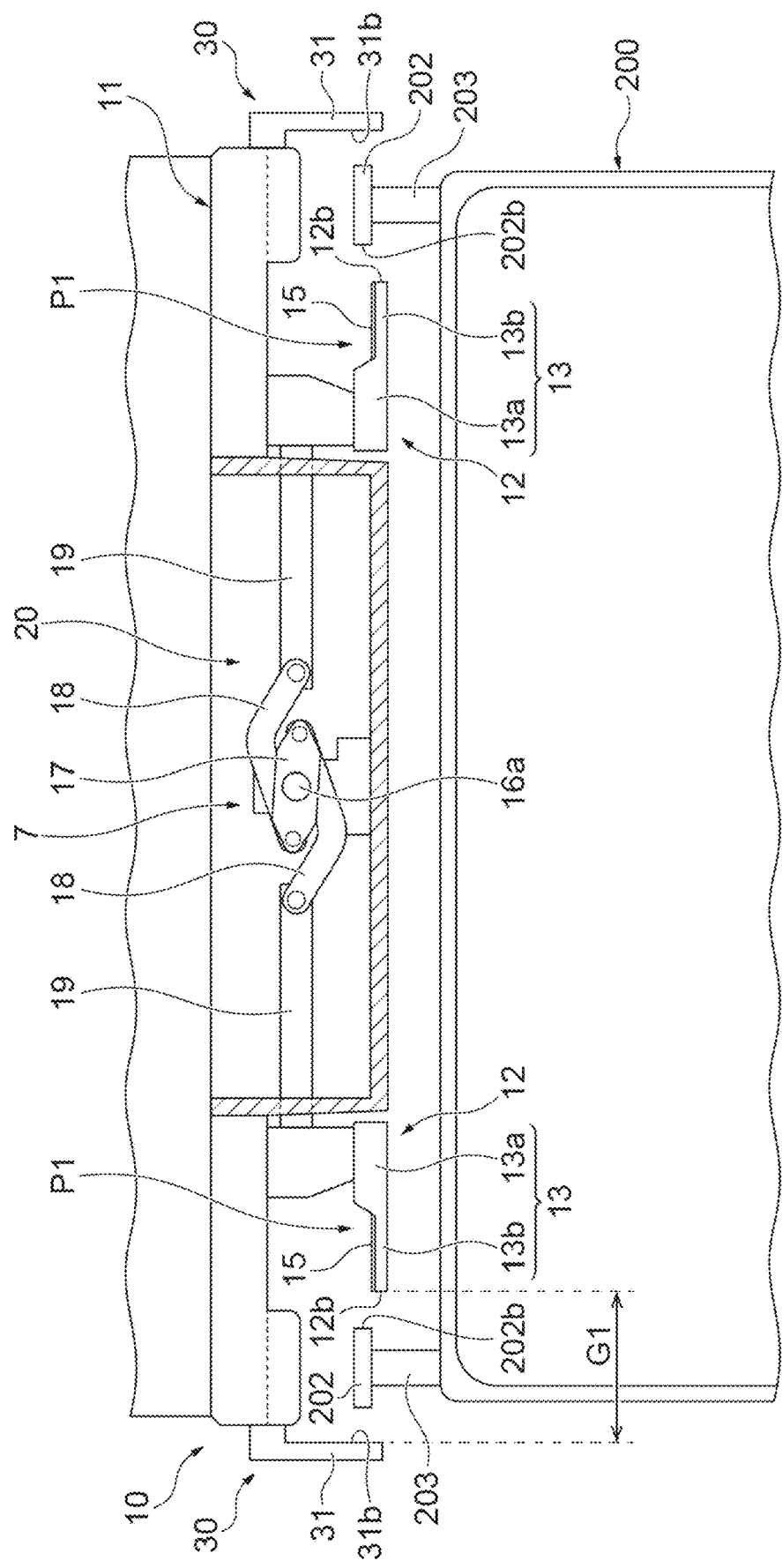
FIG. 4 is a diagram of the gripper device viewed from a side, indicating a state where a pair of engaging portions are located in a standby position.
Figure 5:
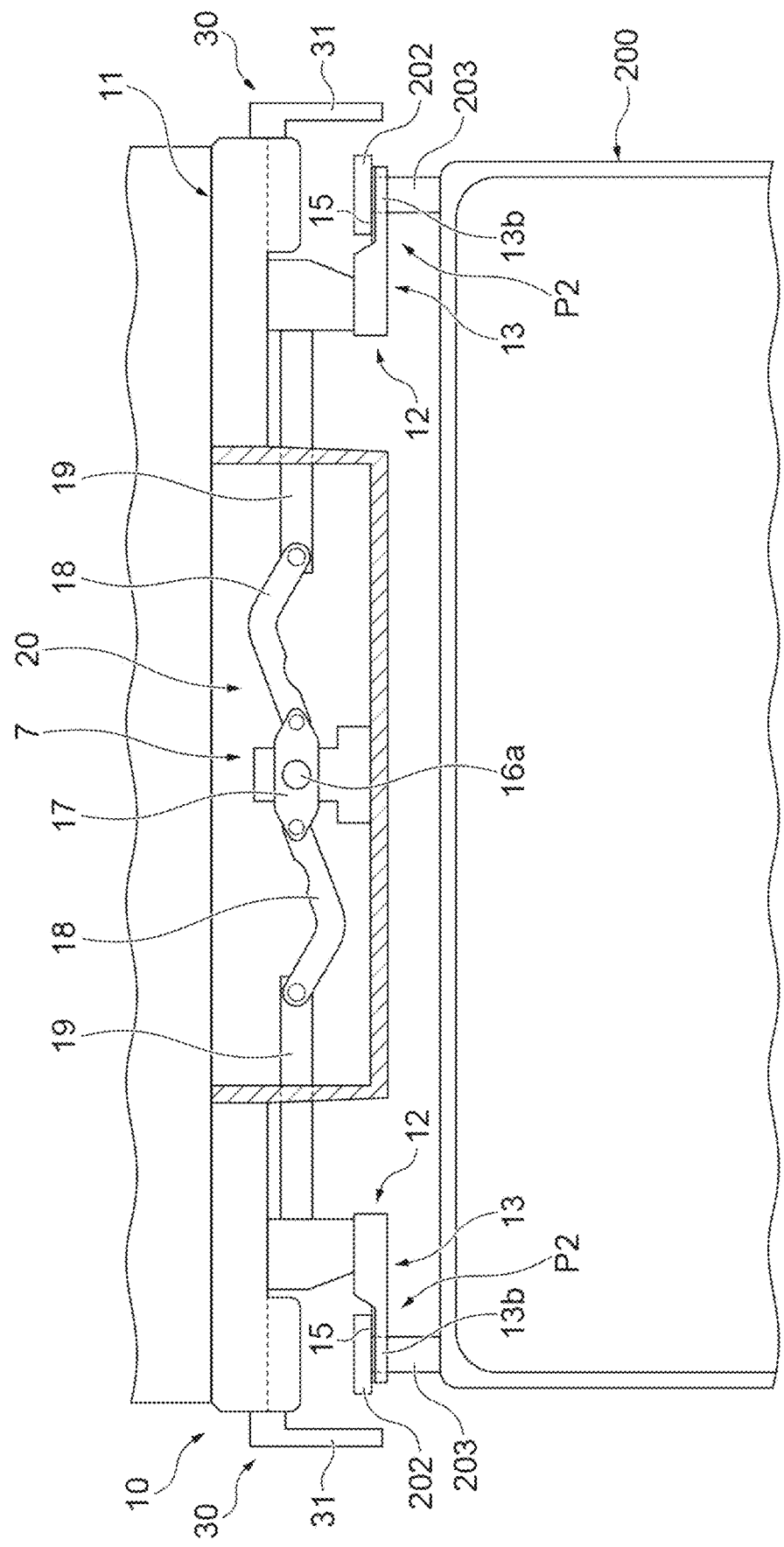
FIG. 5 is a diagram of the gripper device viewed from the side, indicating a state where the pair of engaging portions are located in an engaging position.

Referring to FIGS. 2, 4, and 5, the gripper device 10 is described in detail. The pair of finger sections 12 of the gripper device 10 move along the first direction (X direction indicated in the figure). The pair of finger sections 12 are supported by the elevating section 11 so as to be able to move (slide) horizontally in the gripper device 10. When the gripper device 10 holds the FOUP 200, the finger sections 12 advance to be closer to the flange section 202. When the gripper device 10 releases its holding of the FOUP 200, the finger sections 12 retreat so as to be away from the flange section 202.

As illustrated in FIGS. 2 and 4, the link mechanism 20 moves the finger section 12. The link mechanism 20 includes a single central link 17 that is connected to the output shaft 16a of the motor 16 and rotates about the output shaft 16a, a pair of first links 18 the first ends of which are rotatably connected to a pair of shafts 17a provided at both ends of the central link 17, and a pair of second links 19 the base ends of which are rotatably connected to a pair of shafts 18a provided at the second ends of the first links 18. As illustrated in FIGS. 4 and 5, as the output shaft 16a rotates, the central link 17 rotates, and one of the first links 18 and one of the second links 19 and the other of the first links 18 and the other of the second links 19 move synchronously. The finger section 12 is attached to the tip of each of the pair of second links 19.

As illustrated in FIG. 2, the finger section 12 includes an engaging plate 13 that is rectangular in plan view. This engaging plate 13 is inserted into the space between the top surface 201a of the FOUP 200 and the flange section 202, and supports the flange section 202 from below. The pair of finger sections 12 of the gripper device 10 engage with the pair of flange sections 202 of the FOUP 200.

Figure 6:
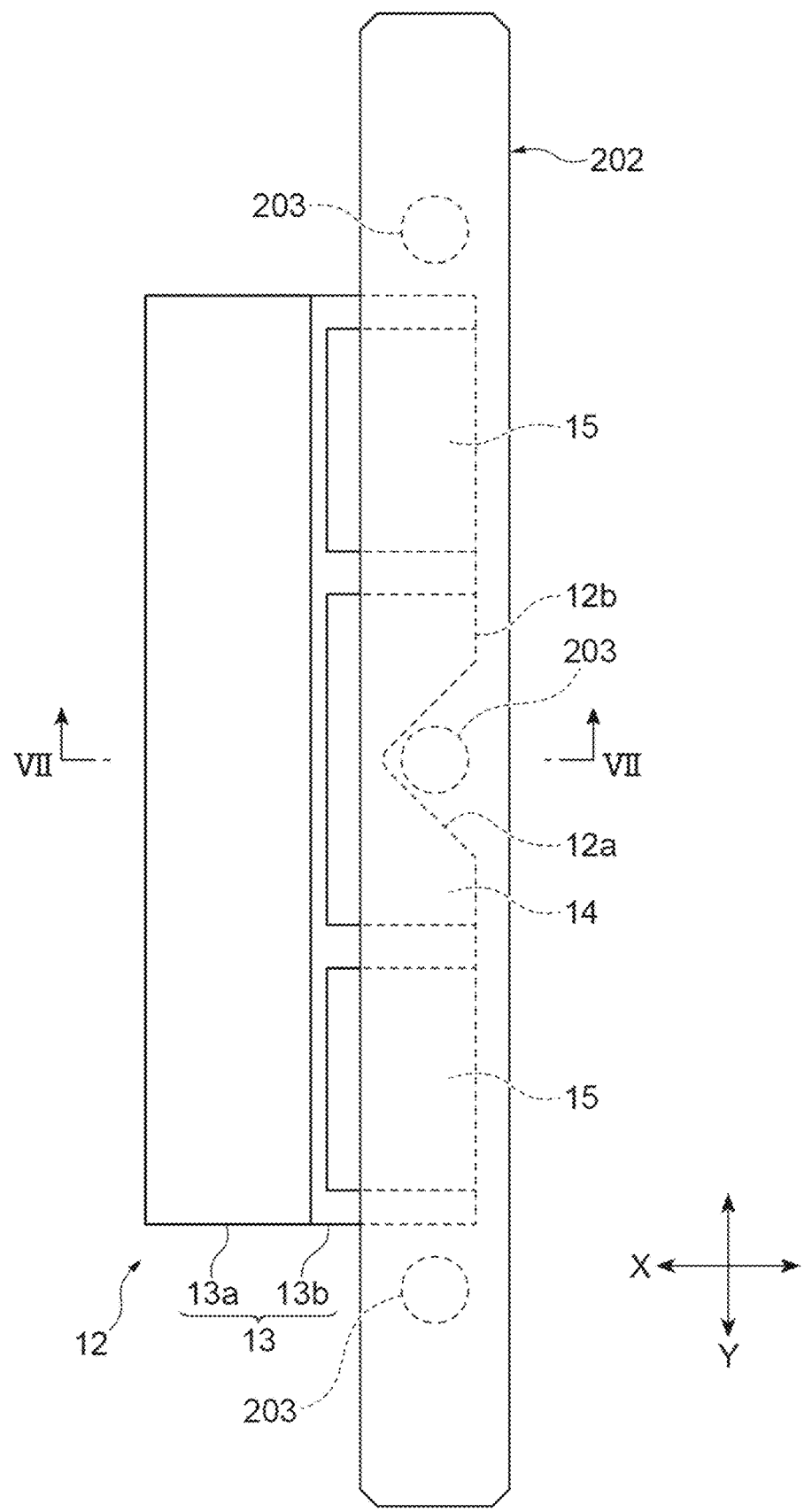
FIG. 6 is a plan view indicating a state where the engaging portion engages with the held portion.
Figure 7:
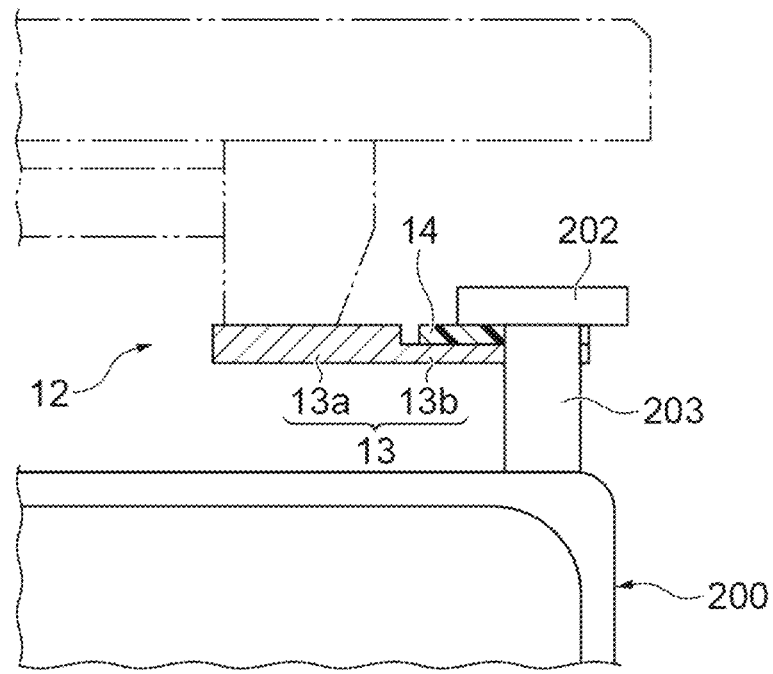
FIG. 7 is a cross-sectional view along VII-VII line of FIG. 6.

More specifically, as illustrated in FIGS. 6 and 7, the engaging plate 13 includes a thick plate section 13a attached to the tip of the second link 19 and a thin plate section 13b on the tip side of the thick plate section 13a. As illustrated in FIG. 7, the thin plate section 13b is thinner than the thick plate section 13a. A bottom surface of the thin plate section 13b is flush with a bottom surface of the thick plate section 13a, but a top surface of the thin plate section 13b is at a position lower than a top surface of the thick plate section 13a, and a single sheet of first buffer member 14 and two sheets of second buffer members 15 having predetermined thicknesses are affixed to the top surface of this thin plate section 13b. These first buffer member 14 and second buffer members 15 are, for example, resin members. The second buffer members 15 having a rectangular shape are affixed to both ends of the thin plate section 13b in the second direction, and the first buffer member 14 having a rectangular shape is affixed between the second buffer members 15.

The position where the second buffer member 15 is affixed corresponds to the position of the center column 203 of the three columns 203 erected on the FOUP 200. The thin plate section 13b and the first buffer member 14 have triangular notches having substantially equal size and shape formed therein. Accordingly, a notch 12a that accepts the center column 203 is formed in the finger section 12. The notch 12a is, for example, a V-shaped depression containing two oblique edges and is open at a tip 12b of the finger section 12 in the X direction thereof. The length of the engaging plate 13 in the Y direction is shorter than the interval between the columns 203 located at both ends. In a state where the notch 12a in the finger section 12 accepts the central column 203 (i.e., the central column 203 fits in the notch 12a), the finger section 12 is disposed between the columns 203 located at both ends (see FIG. 6).

Referring again to FIGS. 4 and 5, the range of movement of the finger section 12 is explained. The drive section 7 moves the pair of finger sections 12 along the first direction between a standby position P1 (see FIG. 4), where the distance between the pair of finger sections 12 is shorter than the interval between the pair of flange sections 202, and an engaging position P2, where the pair of finger sections 12 is capable of engaging with the flange sections 202. This engaging position P2 is a position such that the distance between the pair of finger sections 12 is longer than the interval between the pair of flange sections 202. In the present preferred embodiment, with the link mechanism 20, the pair of finger sections 12 move linearly. The "distance between a pair of finger sections 12" is a distance between the tips 12b of the finger sections 12 indicated in FIG. 4. The "interval between the pair of flange sections 202" is the distance between inner ends 202b in the first direction of the pair of flange sections 202 indicated in FIG. 4.

In other words, the drive section 7 moves the pair of finger sections 12 along the first direction from the standby position P1 to the engaging position P2 such that the pair of finger sections 12 are separated from one another. In other words, the drive section 7 moves the pair of finger sections 12 from inside (closer to the center of the elevating section 11) to outside (closer to the front frame 22 and rear frame 23) of the elevating section 11. Thus, the drive section 7 extends and deploys the pair of finger sections 12. The drive section 7 moves the pair of finger sections 12 along the first direction from the engaging position P2 to the standby position P1 such that the pair of finger sections 12 are closer to each other. In other words, the drive section 7 moves the pair of finger sections 12 from outside (closer to the front frame 22 and rear frame 23) to inside (closer to the center of the elevating section 11) of the elevating section 11. Thus, the drive section 7 retracts and stores the pair of finger sections 12.

Furthermore, the gripper device 10 in the present preferred embodiment includes a drop preventing section 30 that prevents the FOUP 200 from dropping in a case where the device (the FOUP 200 or the finger section 12) is damaged. As illustrated in FIGS. 2 and 5, a pair of the drop preventing sections 30 are fixed to both ends of the elevating section 11 in the first direction. The pair of drop preventing sections 30 are disposed so as to be spaced apart in the first direction with an interval longer than the interval between the pair of flange sections 202. More specifically, the pair of drop preventing sections 30 are spaced apart in the first direction by an interval longer than the distance between outer ends 202a (see FIG. 8) of the pair of flange sections 202 in the first direction. Each of the drop preventing sections 30 includes a hanging plate 31 that hangs from the elevating section 11. A lower end 31a of the hanging plate 31 is located at a lower height than the flange section 202 in a state where the gripper device 10 is lowered and the height of the gripper device 10 with respect to the FOUP 200 is adapted. More specifically, in a state where the finger section 12 engages with the flange section 202 and the gripper device 10 holds the FOUP 200 (the state indicated in FIGS. 5 and 8), the lower end 31a of the hanging plate 31 is at a lower height than the flange section 202, and an inner surface 31b of the hanging plate 31 faces the outer end 202a of the flange section 202 with a predetermined gap.

Figure 8:
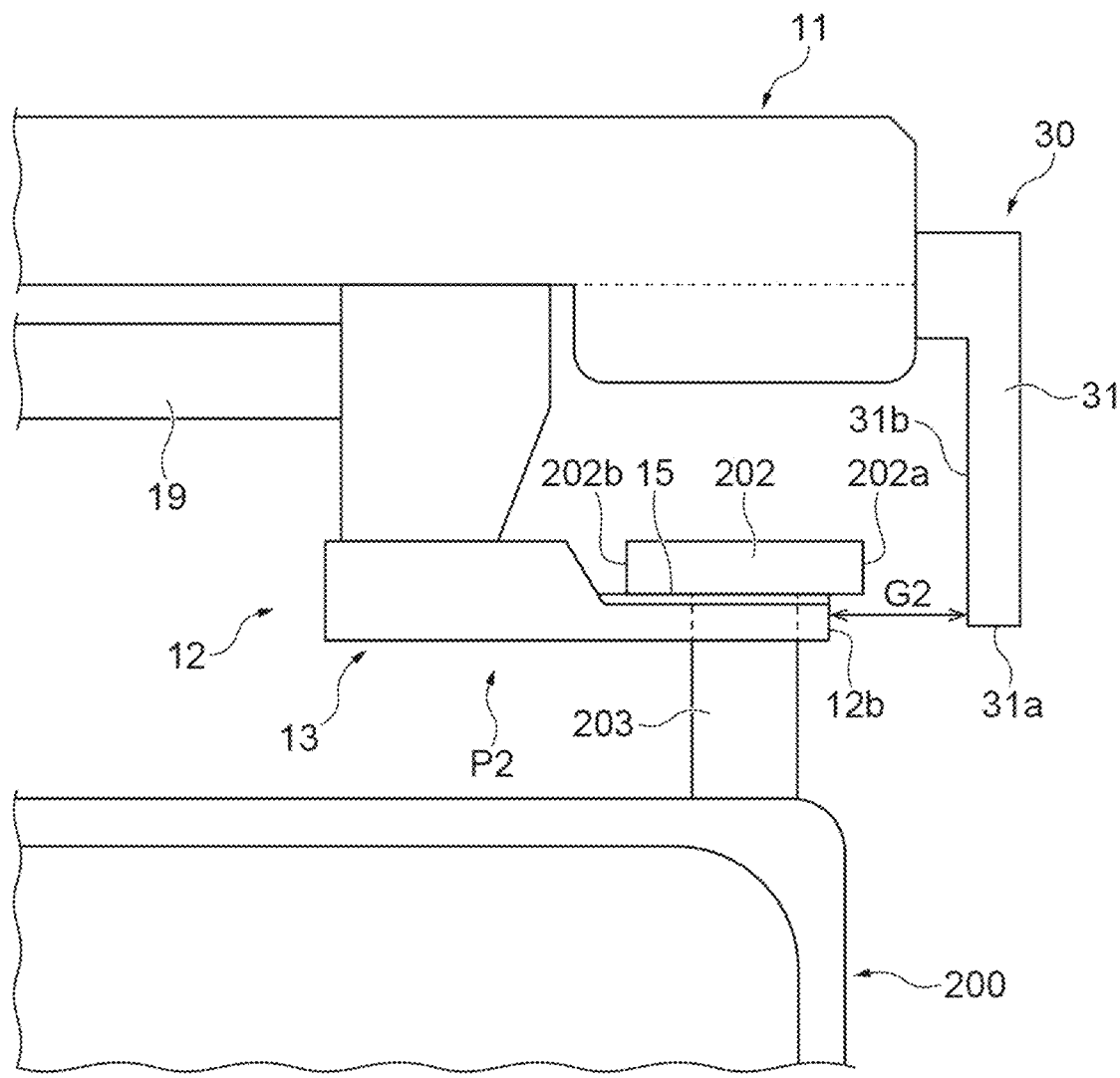
FIG. 8 is an enlarged view of a portion of FIG. 5.

As illustrated in FIG. 4, a first gap G1 is provided between each of the pair of drop preventing sections 30 and each of the pair of finger sections 12 located at the standby position P1, the first gap G1 allowing each of the pair of flange sections 202 to vertically pass therethrough. As illustrated in FIG. 8, a second gap G2 is provided between each of the pair of drop preventing sections 30 and each of the pair of finger sections 12 located at the engaging position P2, the second gap G2 not allowing each of the pair of flange sections 202 to pass vertically therethrough. The first gap G1 and the second gap G2 may be defined as a distance between the tip 12b of the finger section 12 and the inner surface 31b of the hanging plate 31. The first gap G1 is larger than the flange section 202 in size in the first direction. The second gap G2 is smaller than the flange section 202 in size in the first direction.

The following describes the conveyance method of the FOUP 200 by the overhead conveyance vehicle 1 including the gripper device 10 of the present preferred embodiment. Each of the following operations is performed based on control by the controller 8. First, in a state where the horizontal position of the gripper device 10 is located directly above the load port 300, the elevating section 11 is lowered (lowering step). In this lowering step, positioning of the gripper device 10 in the height direction and the horizontal direction relative to the FOUP 200 is performed using known positioning means or the like provided in the elevating section 11. Then, the drive section 7 moves the pair of finger sections 12 along the first direction from the standby position P1, where the distance between the pair of finger sections 12 is shorter than the interval between the pair of flange sections 202, to the engaging position P2, where the pair of finger sections 12 is capable of engaging with the flange sections 202 (for the moving step, see FIGS. 4 and 5). This step allows the center column 203 to enter the notch 12a in the finger section 12, and the finger section 12 to be inserted into the bottom surface side of the flange section 202. Furthermore, the elevating section 11 is lifted and the pair of finger sections 12 at the engaging position P2 engage with the pair of flange sections 202, and the FOUP 200 is held by the gripper device 10 (holding step).

According to the gripper device 10 of the present preferred embodiment, the pair of finger sections 12 attached to the elevating section 11 is moved by the motor 16 from the standby position P1 to the engaging position P2. The top surface 201a of the FOUP 200 is provided with a pair of flange sections 202 spaced apart in the first direction. The pair of finger sections 12 are disposed between (inside) these pairs of flange sections 202 when the gripper device 10 is to hold the FOUP 200, and are moved from inside to outside of the FOUP 200 along the first direction above. This arrangement of the finger sections 12 and their movement and engagement in the first direction makes the gripper device 10 compact as a whole. According to this gripper device 10, an article is able to be held in the compact configuration.

Since only one link mechanism 20 is used to move a pair of finger sections 12, the structure is simpler than when multiple link mechanisms are used. In addition, since a single common link mechanism 20 is provided for the pair of finger sections 12, the movements of the pair of finger sections 12 are able to be easily synchronized.

Figure 9:
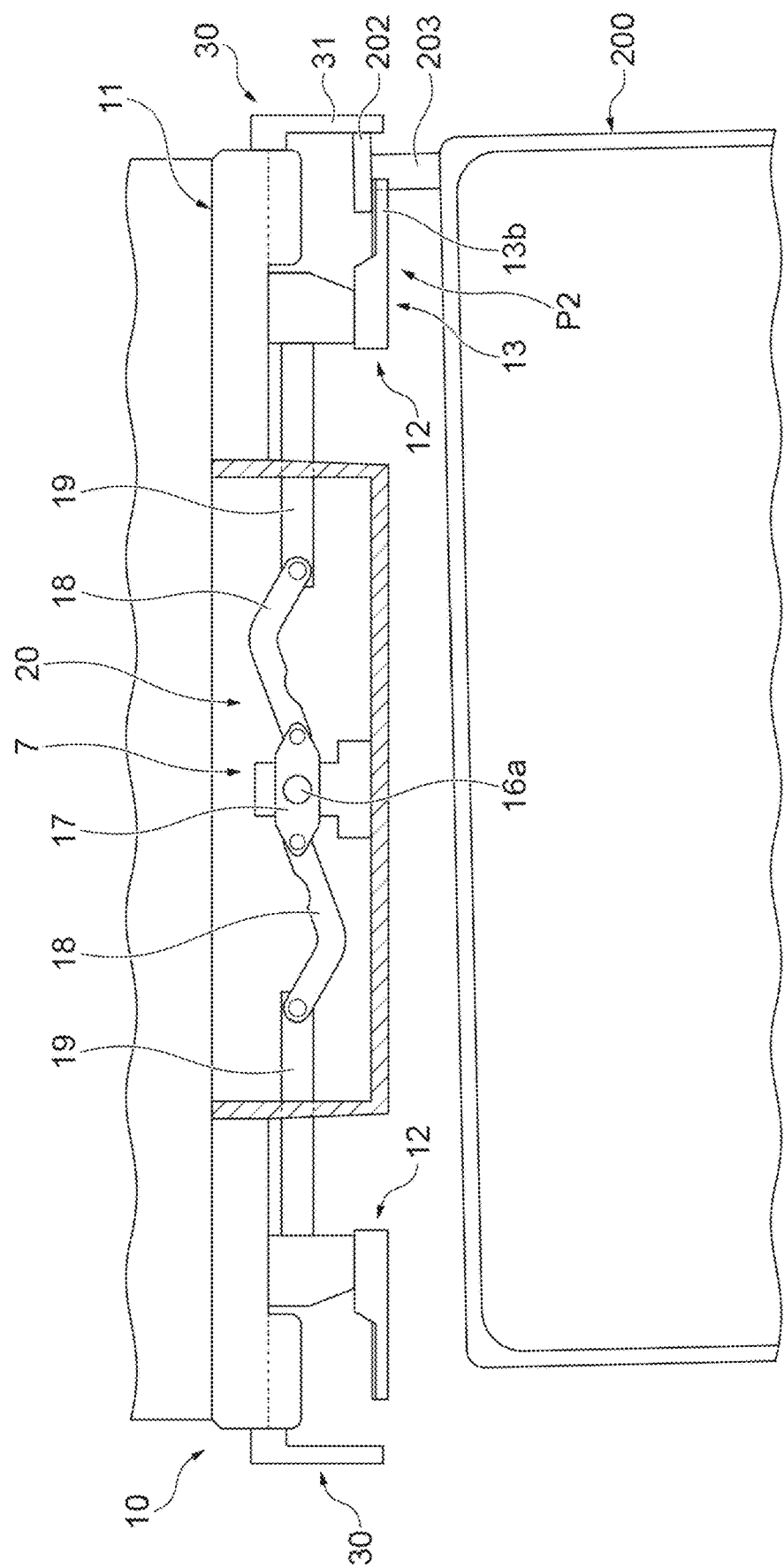
FIG. 9 is a diagram indicating a state where one of the held portions is held when the other of the held portions is damaged.

When the elevating section 11 is lowered in a state where the pair of finger sections 12 are located at the standby position P1, the flange section 202 passes through the first gap G1 between the finger section 12 and the drop preventing section 30 in each of both end regions in the first direction (see FIG. 4). When the pair of finger sections 12 are moved to the engaging position P2 to engage with the pair of flange sections 202, the flange sections 202 are not able to pass through the second gap G2 between the finger section 12 and the drop preventing section 30 in each of both end regions in the first direction (see FIG. 5). For example, as illustrated in FIG. 9, even if the first flange section 202 (or the first finger section 12) is damaged due to some unforeseen event, the second flange section 202 is held and maintained between the second finger section 12 and the second drop preventing section 30. Thus, either one of the engagement structures can be maintained, and the FOUP 200 can be held and the FOUP 200 is able to be prevented from dropping.

When a proper engagement structure for the flange section 202 is not provided in any of the finger sections 12 (in a case as exemplified in FIG. 9), the controller 8 may detect absence of the flange section 202, upon receiving a signal from a known sensor (e.g., a presence sensor or the like) installed in a positioning section of the elevating section 11, for example. The controller 8, upon detecting absence of the flange section 202, may generate an alarm or inform the operator of the absence. With this approach, it is possible to detect not only the absence of the flange section 202, but also damage to the finger section 12.

When the column 203 is provided on the FOUP 200, a space into which the finger section 12 is inserted is able to be easily provided between the top surface 201a of the FOUP 200 and the flange section 202. The column 203 defines and functions as a spacer. In the movement of the finger section 12 in the first direction, it is possible to perform control, for example, to make a portion of the finger section 12 contact the column 203 from the inside. In such a case, the finger section 12 is able to be positioned securely and easily.

According to the overhead conveyance vehicle 1 of the present preferred embodiment, since the gripper device 10 has the compact configuration, the overhead conveyance vehicle 1 is able to be made compact and lightweight relative to the FOUP 200 in the size, the weight, and the like.

According to the above-described conveyance method of the present preferred embodiment, the same actions and effects as those of the overhead conveyance vehicle 1 and gripper device 10 described above are achieved. In other words, in the holding step, the FOUP 200 is able to be held in the compact configuration. The gripper device 10 has the compact configuration, and is able to make use of the advantage that the device is compact and light weight when carrying the held FOUP 200. For example, the conveyance method of the present preferred embodiment is also advantageous in terms of providing faster carrying speeds and reducing power consumption.

Although the preferred embodiments of the present disclosure have been described above, the present invention is not limited to the above-described preferred embodiments. For example, either one or both of the lower drop preventing section 26 and the lid drop preventing section 27 may be omitted. Not limited to cases where the plurality of pairs of columns 203 are erected on the top surface 201a of the FOUP 200, only one pair of the pairs of columns 203 may be erected on the top surface 201a of the FOUP 200. In other words, the columns 203 at both ends in the Y direction may be omitted. In such a case, the column 203 may be erected in substantially the center of the flange section 202 in an extending direction. The pair of flange sections 202 may be somewhat beyond the length of the body 201 in the first direction (the overall length of the FOUP 200).

Preferred embodiments of the present invention are not limited to cases where the drive section 7 has only one link mechanism 20. The first finger section 12 and second finger section 12 may be driven separately. Each of the finger sections may be driven by a ball screw, a belt, or the like, for example, instead of the link mechanism.

The pair of engaging portions may be moved along the top surface 201a of the FOUP 200 in a direction that is linear and at an angle to the first direction. It is not limited to the case where the pair of engaging portions are moved linearly by the drive section, but the pair of engaging portions may be moved along the top surface 201a of the FOUP 200 in a zigzag manner, for example. The pair of engaging portions may be moved along the top surface 201a of the FOUP 200 in a curved shape, for example.

An article is not limited to the FOUP 200. The article may be a standard mechanical interface (SMIF) pod or a front opening shipping box (FOSB), or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A gripper device to hold an article including a pair of held portions that are provided on a top surface of the article and that are spaced apart in a direction along the top surface, the gripper device comprising:
   a pair of engaging portions that are attached to an elevating section capable of lifting and lowering above the article and that respectively engage with the pair of held portions;
   a driver to move the pair of engaging portions along the direction, from a standby position where a distance between the pair of engaging portions is less than a particular interval between the pair of held portions, to an engaging position where the pair of engaging portions is capable of engaging with the pair of held portions, such that the pair of engaging portions separate from one another; and a pair of drop preventing sections that are fixed to the elevating section to be spaced apart in the direction with a longer interval than the particular interval; wherein a first gap exists between each of the pair of drop preventing sections and each of the pair of engaging portions at the standby position, the first gap allowing each of the pair of held portions to vertically pass therethrough; and a second gap exists between each of the pair of drop preventing sections and each of the pair of engaging portions at the engaging position, the second gap not allowing each of the pair of held portions to vertically pass therethrough.

2. The gripper device according to claim 1, wherein the driver includes a single link mechanism to move the pair of engaging portions.

3. A conveyance vehicle that includes the gripper device according to claim 1 and travels along a track provided on a ceiling.

4. A gripper device to hold an article including at least a pair of columns on a top surface of the article and a pair of held portions fixed to the columns and spaced apart in a direction along the top surface, the gripper device comprising:

a pair of engaging portions that are attached to an elevating section capable of lifting and lowering above the article and that respectively engage with the pair of held portions; and a driver to move the pair of engaging portions along the direction, from a standby position where a distance between the pair of engaging portions is less than a particular interval between the pair of held portions, to an engaging position where the pair of engaging portions is capable of engaging with the pair of held portions, such that the pair of engaging portions separate from one another; wherein each of the pair of engaging portions includes a notch that accepts the column when the pair of engaging portions are located in the engaging position.

5. A conveyance method for holding and carrying, with a gripper device, an article with a pair of held portions that are provided on a top surface of the article and spaced apart in a direction along the top surface, the gripper device including a pair of engaging portions attached to an elevating section capable of lifting and lowering above the article and that respectively engage with the pair of held portions, and a pair of drop preventing sections that are fixed to the elevating section to be spaced apart in the direction with a longer interval than a particular interval between the pair of held portions, the conveyance method comprising:

lowering the elevating section;

moving the pair of engaging portions along the direction, from a standby position where a distance between the pair of engaging portions is less than the particular interval, to an engaging position where the pair of engaging portions is capable of engaging with the pair of held portions; and holding the article by causing the elevating section to lift and causing the pair of engaging portions in the engaging position to engage with the pair of held portions; wherein a first gap exists between each of the pair of drop preventing sections and each of the pair of engaging portions at the standby position, the first gap allowing each of the pair of held portions to vertically pass therethrough; and a second gap exists between each of the pair of drop preventing sections and each of the pair of engaging portions at the engaging position, the second gap not allowing each of the pair of held portions to vertically pass therethrough.

* * * * *